NON-SATURATING TRANSISTOR LOGIC CIRCUIT

Filed Dec. 28, 1960

INVENTOR
JAMES L. WALSH

BY Joseph C. Redmond, Jr.

ATTORNEY

United States Patent Office 3,400,278

Patented Sept. 3, 1968

3,400,278
NON-SATURATING TRANSISTOR LOGIC CIRCUIT

James L. Walsh, Hyde Park, N.Y., assignor to International Business Machines Corporation, New York, N.Y., a corporation of New York Filed Dec. 28, 1960, Ser. No. 78,928
3 Claims. (Cl. 307—215)

This invention relates to logic circuits and more particularly to transistor logic circuits including means for preventing saturation of the active elements thereof.

Computers and other information handling apparatus require logic circuits which have high switching speed in order to process rapidly the information supplied thereto. One problem in obtaining high speed switching circuits employing transistors is to prevent saturation of the transistors. Transistor saturation delays the switching speed of logic circuits as described in an article entitled, "Comparison of Saturated and Non-Saturated Switching Circuit Techniques," by G. H. Goldstick, which appeared in the IRE Transactions on Electronic Computers, June, 1960, pages 161 through 171. The previously mentioned article also discloses techniques for preventing transistor saturation. Among these techniques is clamping the collector of a transistor to a supply voltage through a diode so that the voltage thereof can not fall below the base voltage to forward bias the collector junction into the saturation region. Another technique is to control the base current in such a way that the collector current is limited to a value which is slightly below the saturation level. Both of these techniques have limitations. In the former instance, the turn off time of the transistor is increased since the collector voltage can not increase until turn off of the diode occurs which may have a long recovery time where high currents have been handled. In the latter instance, the collector emitter voltage can also decrease under certain conditions, if the collector current is decreased which thereby permits the transistor to be driven into saturation. Also, the previously described techniques do not provide uniformly high switching speeds for a variety of types of transistors since varying transistor Beta characteristics, commonly referred to as collector current to base current ratios, will alter the switching speeds of the transistors. The structural arrangement of these circuits which control the collector current or the base current or the collector base voltage may also be complicated and costly in construction. In order to obtain a simple basic logic circuit suitable for use with a variety of transistors, it is desirable, therefore, to improve transistor saturation control circuits in order that transistors having varying Beta characteristics will not alter the speed of the logic circuits.

An object of the invention is an improved transistor logic circuit with means for preventing saturation of the transistor.

Another object is a transistor logic circuit employing negative voltage feedback for saturation control purposes.

Still another object is a transistor saturation control circuit that may be employed with a wide variety of transistors having varying Beta characteristics.

These and other objects are accomplished in the present invention, one illustrative embodiment of which comprises a logic circuit adapted to provide output signals that are the Boolean complement of the input signals. The logic circuit comprises an AND-invert circuit including a transistor connected in a common emitter configuration and having the base thereof coupled to an input circuit with suitable means for receiving a plurality of input signals. The collector is connected through a resistor of suitable magnitude to a source of potential of preselected polarity. A feedback circuit connects the collector to the base and to a non-linear impedance which is connected between the base and the emitter of the transistor. The output of the AND-invert circuit is connected to a power gain circuit which is connected in a common collector configuration. The collector of the power circuit is connected to the source of potential and the emitter thereof is connected through a non-linear impedance to a source of potential of polarity opposite to that of the collector polarity. The output of the logic circuit is taken across a resistor included in the emitter of the power gain circuit. Normally, the AND-invert transistor is non-conducting and the power gain transistor conducting. When a negative input signal is supplied to the AND-invert circuit, the transistor thereof is driven into conduction and the collector potential decreases. Simultaneously, negative voltage feedback occurs from the collector to the base. The negative voltage feedback also lowers the potential across the base emitter junction which tends to turn off the transistor. As the transistor turns off, the collector potential rises again which in turn increases the base emitter potential sufficiently to turn the transistor back on. Turn on and turn off of the transistor occur until a stable operating point is realized which is outside the saturation region of the AND-invert transistor. The AND-invert output signal is amplified by the power gain circuit and appears at the output thereof as the complement of the input signal. Release of the input signal restores the logic circuit to the normal off condition.

A feature of the present invention is means including a non-linear impedance for operating a transistor outside of the saturation region thereof without regard to the Beta characteristic of the transistor.

Another feature of the present invention is a negative feedback path for voltage control of the base-emitter junction of a transistor such that when an input pulse is received the base-emitter junction voltage will be at all times greater than the collector-base junction and thereby prevent saturation of the transistor.

Another feature of the invention is a non-linear impedance connected between the base and emitter electrodes of a transistor to turn on the transistor for signals of small amplitude and short duration and to operate the transistor outside of the saturation region thereof.

Still another feature of the invention is means connected between the collector and base electrodes of the transistor to provide an operating characteristic for a non-linear impedance which will operate a transistor outside the saturation region thereof.

The foregoing and other objects, features and advantages of the invention will be apparent from the following more particular description of preferred embodiments of the invention, as illustrated in the accompanying drawings wherein.

Figure 1:
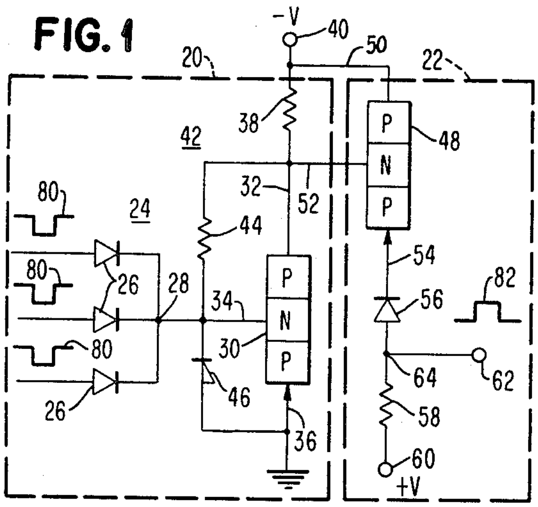
FIG. 1 is an electrical schematic of one embodiment of the present invention which includes an AND-invert circuit in combination with a power gain circuit.

Referring to FIG. 1, one embodiment of the invention is shown including an AND-invert circuit 20 and a power gain circuit 22 in combination to provide a Dagger block which is one of the basic logic circuits employed in computers and other information handling apparatus. Dagger blocks are described in an article entitled, "Synthesizing Minimal Stroke and Dagger Functions," by J. Earle which was published as IBM Technical Note (TN 00.08001.381). The AND-invert circuit includes an input circuit 24 comprising a plurality of diodes 26 connected to a common node 28. The diodes are normally biased in the forward direction and each is adapted to be turned off when a negative pulse is supplied thereto. The input circuit is also connected to a transistor 30 which in cludes a collector electrode 32, a base electrode 34, and an emitter electrode 36, the connection of the input circuit being to the base electrode 34.

The transistor is connected in the well known common emitter configuration with the collector connected through a resistor 38 of suitable magnitude to a source of potential 40. The polarity of the source 40 will vary according to the type of transistor employed in the circuit. For the purposes of description, the source 40 is indicated as having a negative polarity to bias suitably the transistor 30 which is of the PNP type. It should be understood, however, that the present invention is not limited to PNP transistors but may employ NPN type transistors. A PNP type transistor has been selected solely for reasons of convenience in explanation of the present invention. To complete the common emitter configuration of the transistor, the emitter 36 is connected to a reference potential, typically ground.

A feedback circuit 42 is connected between the collector and base electrodes, the feedback circuit including a resistor 44 which controls the voltage across the base collector electrodes of the transistor. The feedback circuit also biases a non-linear impedance 46 which is connected between the base and emitter electrodes of the transistor. The non-linear impedance is shown as a bistable semiconductor device, typically a tunnel diode in order that the AND-invert circuit be responsive to signals of low amplitude and short duration. Also, the tunnel diode eliminates the need for a voltage supply to bias the transistor off. It should also be noted that although a tunnel diode is shown as the non-linear impedance between the base and emitter electrodes, the present invention is operable with other types of non-linear impedances, for example, an asymmetrical diode.

The output from the AND-invert circuit is taken from the collector 32 and connected to a transistor 48 which is of the same type as the transistor 30. The transistor 48 includes a collector 50, a base 52, and an emitter 54, the base being connected to the output of the AND-invert circuit. The collector 50 is connected to the source 40 and the emitter 54 is connected through a diode 56 and a resistor 58 to a source of potential 60. The diode 56 is employed to bias suitably the emitter collector voltage for proper operation of the transistor. An output circuit 62 is connected to the emitter at a node 64 between the diode and the resistor in order to obtain a high current output signal which is of opposite polarity to a signal supplied to the input circuit 24.

Figure 2:
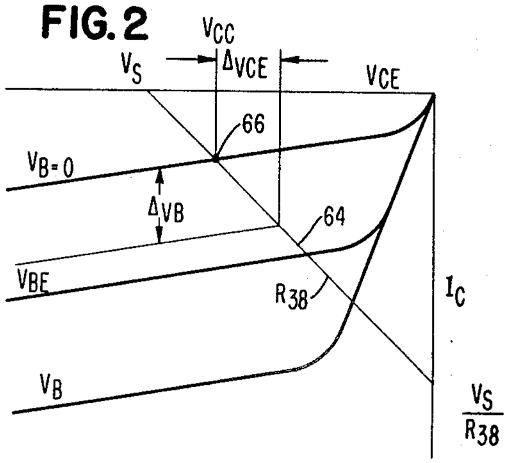
FIG. 2 is a graph of the collector-emitter voltage and the collector current of a transistor included in the AND-invert circuit disclosed in FIG. 1.

The transistor 30 is adapted to be operated outside of the saturation region by the feedback circuit 42 and the non-linear impedance 46 which maintain the base-emitter voltage at a higher level than the voltage across the base-collector junction when a negative signal is impressed on all of the diodes 26. The reasons for the base-emitter junction being at a higher voltage will become apparent from FIGS. 2 and 3 together with FIG. 4, the former two figures disclosing the operation of the transistor 30 without the feedback circuit connected thereto and the operation of the feedback circuit 42 including the non-linear impedance 46 without the transistor connected thereto, respectively. Considering FIG. 2, it will be seen that a load line 64 can be constructed on the well known PNP transistor collector-emitter voltage $V_{ce}$ and collector current characteristic $I_c$. The load line intercepts the $V_{ce}$ axis at the supply voltage ($V_s$) of the source 40. The load line also intercepts the $I_c$ axis for a current equal to the source 40 potential magnitude ($V_s$) divided by the impedance value of the resistor 38. Normal operation of the transistor occurs at a point 66 which corresponds to a base voltage ($V_b$) equal to zero thereby placing the transistor in a cut off condition. Variations of the base-emitter voltage ($C_{be}$) with respect to the collector voltage ($V_{ce}$) can be obtained from FIG. 2. These variations can be plotted on FIG. 4 as curve 67 which indicates the change in $V_{ce}$ for a change in $V_{be}$. It will be noted in FIG. 4 that when $V_{ce}=V_{be}$ the transistor will be in saturation.

Figure 3:
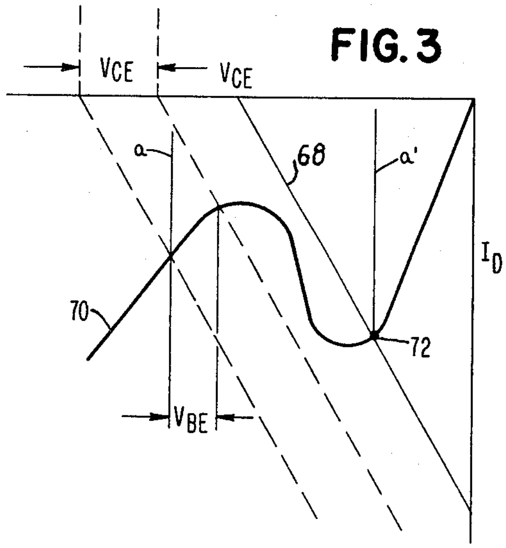
FIG. 3 is a graph of the voltage across and the current through a non-linear impedance connected between the base and emitter electrodes of the transistor included in the AND-invert circuit of FIG. 1.

Operation of the feedback circuit and the non-linear impedance, which is shown as a tunnel diode, is indicated in FIG. 3 wherein a load line 68 is established on a conventional characteristic curve 70 of a tunnel diode. The ordinate of the curve is diode current $I_d$ and the abscissa is collector voltage $V_{ce}$. The slope of the load line is proportioned to the impedance value of the resistor 44 for reasons which are believed to be apparent to a worker skilled in the art. The load line intersects curve 70 at an operating point 72 to bias monostably the diode. When an input pulse is received, the load line is shifted to switch the diode into the high impedance condition. On release of the input pulse, the diode returns to the operating point 72. The changes in $V_{ce}$ can be determined from the shift in the load line intercepts with the abscissa. The changes in $V_{bc}$ can be determined from the change in tunnel diode voltage which is indicated by vertical lines $a$–$a^1$ in FIG. 3. A plot of the change in $V_{ce}$ and $V_{be}$ for the tunnel diode has been constructed as curve 76 on FIG. 4. The curves 66 and 76 intersect at a point 78 which is a stable operating point for both the transistor and the tunnel diode. It will be also noted that the operating point is outside of the saturation region of the transistor.

The normal condition of the present invention is with the transistor 30 cut off and the transistor 48 conducting. Transistor 30 is cut off by the diodes 26 being in a forward biased condition which reduces the negative voltage across the tunnel diode 46 to place the latter in the low voltage condition. As a consequence, there is insufficient voltage across the base-emitter junction to bias the transistor 30 into conduction. Accordingly, the collector potential of transistor 30 increases which turns on transistor 48. The output voltage at the terminal 62 approaches that of the source 40.

Figure 4:
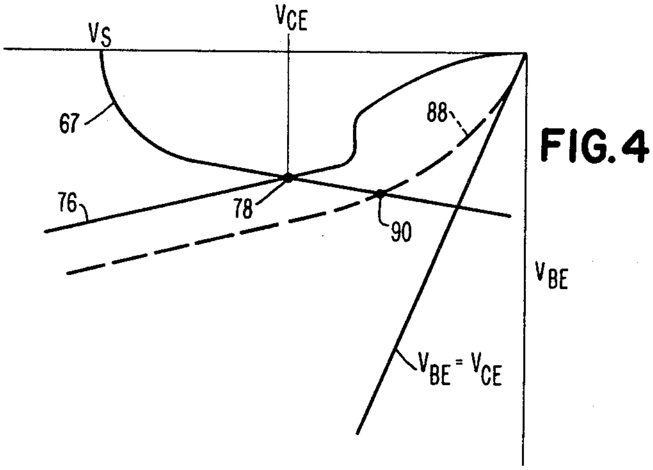
FIG. 4 is a graph of the base-emitter voltage and the collector-base voltage of the transistor and the non-linear impedance included in the AND-invert circuit of FIG. 1; and, FIG. 5 is an electrical schematic of another embodiment of the present invention.

Operation of the circuit shown in FIG. 1 commences when negative input pulses 80 are supplied to the diodes 26. The pulse increases the negative voltage across the diode 46 which switches into the high voltage condition. The increased voltage across the diode 46 back biases the diodes 26 into a non-conducting condition, so that the input circuit is now isolated from the inverting circuit. Also, the voltage across the base-emitter junction of the transistor is raised to place the transistor in the conducting condition. As the transistor 30 conducts, the collector voltage decreases which in turn lowers the voltage across the diode 46 to return the transistor to the non-conducting condition. As conduction through the transistor decreases, the collector voltage increases negatively which again tends to increase the negative voltage across the diode 46. This negative feedback process repeats until an operating point is realized, as indicated in FIG. 4, which satisfies the transistor and the tunnel diode. The transistor remains at this operating point so long as the pulse 80 appears at the input circuit.

When the transistor 30 conducts a positive pulse is supplied to the transistor 48. Transistor 48 switches rapidly since the common collector configuration always operates outside of the saturation region thereof. On switching, current flow through the transistor decreases but does not terminate. Simultaneously, the voltage at the terminal 62 rises toward the value of the source 60. Accordingly, a high current output pulse 82 of opposite polarity to the input pulse 80 is provided by the source 60.

On release of the input pulse, the diode 46 switches back to the low impedance condition and the logic circuit returns to the normal condition. The output voltage, as a consequence, is restored to the value which approaches the magnitude of the source 48.

Broadly, the present invention teaches selecting a negative voltage feedback circuit whose characteristics are such that when an input pulse is applied thereto a load is created for the transistor which will maintain the transistor outside of the saturation region. It should also be noted that when a tunnel diode is employed with the feedback circuit, the operating curve of the diode must intersect the transistor operating curve in the high voltage region of the former in order to prevent oscillations in the circuit.

Thus, the circuit of FIG. 1 provides means for switching rapidly by preventing the transistors included therein from operating in the saturation region. The circuit of FIG. 1 is also responsive to input pulses of low amplitude and short duration since the biasing of the diode 46 is such as to switch the tunnel diode 46 to the high voltage condition when small signals are received. The diode 46 also permits the transistor to be switched without an outside power supply.

Figure 5:
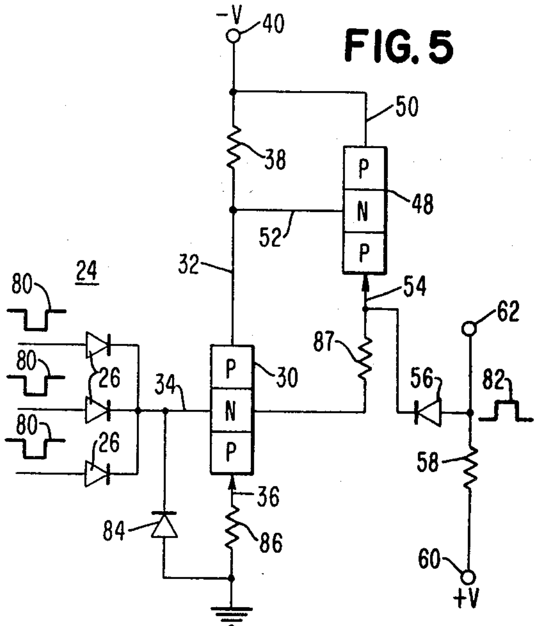

Another embodiment of the invention is shown in FIG. 5 wherein elements corresponding to those shown in FIG. 1 have like reference numerals. It will be noted that the tunnel diode of FIG. 1 has been replaced by a conventional asymmetrical diode 84 and the emitter 36 includes a resistor 86. The operating characteristic of the diode 84 is shown by a dotted line 88 in FIG. 4. Again, the transistor operating curve and the diode operating curve intersect at a point 90 to form a stable operating point for the transistor which is outside the saturation region thereof. The resistor 86 included in the emitter circuit varies the on operating point of the transistor 30 so that the combined operating point 90 may be adjusted further out of the saturation region, in accordance with the value of the resistor 86.

Another variation between the circuit of FIG. 5 and that shown in FIG. 1 is the connection of the power gain circuit to the transistor 30. For FIG. 5 the power gain circuit is included in the feedback circuit between the collector and the base electrodes. A resistor 87 is also included in the connection between the base of the transistor 30 and the emitter of the transistor 48. By applying a limited collector base voltage of the transistor 30 to the base-emitter junction of the transistor 48, the latter device will be operated outside of the saturation regions. With the exception of this difference of application of the input signal to the transistor 48, the circuit of FIG. 5 operates substantially the same as that shown in FIG. 1. Briefly, the transistor 30 is off and the transistor 48 conducting in the normal condition of the circuit. When a negative signal is impressed on the input circuit, the transistor 30 turns on and provides a positive pulse to the power gain circuit. Negative voltage feedback is provided from the power gain circuit, the feedback cooperating with the diode 84 to operate the transistor 30 outside the saturation region thereof. A signal appears at the output of the circuit of FIG. 5 which is the inverse of the input signal.

Although the present invention has disclosed an AND-invert circuit in combination with a power gain circuit, it is believed readily apparent that other transistor logic blocks for example, an OR-invert may be constructed wherein the principles of transistor saturation control disclosed herein are employed. An AND-invert circuit was selected solely for reasons of convenience in disclosing the present invention.

Since the present invention employs negative voltage for ensuring base-emitter voltages greater than collector-base voltages, transistors having widely varying Beta characteristics will not affect the saturation control of the circuit. Saturation control circuits of the type disclosed herein, as a consequence, are simple in construction and inexpensive in cost.

While the invention has been particularly shown and described with reference to preferred embodiment thereof, it will be understood by those skilled in the art that described with reference to preferred embodiments therein without departing from the spirit and scope of this invention.

What is claimed is:

1. A logic circuit comprising a transistor having base, emitter and collector electrodes, an input circuit connected to said base electrode, a negative impedance device connected between the base and emitter electrodes of said transistor, a common collector configuration coupled into a feedback path between the base and collector electrodes of said transistor, means for adjusting the operating point of the transistor outside the saturation region thereof, and output circuit means connected to the common collector configuration for providing an output signal which is the inverse of a signal supplied to the input circuit.

2. A logic circuit having high speed switching and adapted to provide an output signal that is the Boolean complement of an input signal comprising a first transistor having first, second and third electrodes, an input circuit connected to said first electrode and adapted to bias normally said transistor into the non-conducting condition, non-linear impedance connected between the first and second electrodes, responsive to input signals of preselected polarity to place the transistor into a conducting condition, a feedback circuit including a common collector amplifier circuit including a transistor of the same conductivity type as the first transistor, cooperating with said non-linear impedance means to operate the transistor outside the saturation region thereof, means for adjusting the operating point of the transistor outside the region thereof and output circuit means coupled to said common collector amplifier to provide an output signal that is the inverse of the input signal.

3. A switching circuit comprising a transistor of a first conductivity type and having first, second and third electrodes, a power supply and load impedance connected to the third electrode, an input circuit connected to the first electrode, a non-linear impedance connected between the first and second electrodes, said impedance poled in the same direction as the first-second junction of the transistor, a reference potential connected to the second electrode, a second transistor of the first conductivity type including first, second and third electrodes, the first electrode connected to the third electrode of the first transistor, the third electrode connected to the power supply, an impedance means directly connected between the first electrode of the first transistor and the second electrode of the second transistor, a current supply connected to the second electrode of the second transistor and an output circuit connected between the second electrode of the second transistor and the current supply, whereby an input signal of preselected polarity and magnitude renders the first transistor and non-linear impedance conducting and the second transistor, a current supply connected to the the non-linear impedance to prevent the first transistor from saturating.

References Cited

UNITED STATES PATENTS

| | | | |
|---|---|---|---|
| 2,874,312 | 2/1959 | Radcliffe | 307—88.5 |
| 2,887,542 | 5/1959 | Blair et al. | 307—88.5 X |
| 2,962,604 | 11/1960 | Brittain | 307—88.5 |
| 2,990,478 | 6/1961 | Scarbrough | 307—88.5 |
| 2,999,169 | 9/1961 | Feiner | 307—88.5 |
| 3,003,069 | 10/1961 | Clapper | 307—88.5 |
| 3,094,630 | 6/1963 | Rapp et al. | 307—88.5 |
| 3,102,209 | 8/1963 | Pressman | 307—88.5 |

ARTHUR GAUSS, *Primary Examiner.*

H. DIXON, *Assistant Examiner.*